(12) United States Patent
Wu

(10) Patent No.: US 11,442,081 B1
(45) Date of Patent: Sep. 13, 2022

(54) CURRENT SENSING CIRCUIT

(71) Applicant: Quanta Computer Inc., Taoyuan (TW)

(72) Inventor: Tai-Lin Wu, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 17/330,714

(22) Filed: May 26, 2021

(30) Foreign Application Priority Data

Mar. 8, 2021 (TW) .................................. 110108049

(51) Int. Cl.
*G01R 19/165* (2006.01)
*G01R 19/12* (2006.01)

(52) U.S. Cl.
CPC ............ *G01R 19/165* (2013.01); *G01R 19/12* (2013.01)

(58) Field of Classification Search
CPC .............................. G01R 19/165; G01R 19/12
USPC ......................................................... 324/126
See application file for complete search history.

(56) References Cited

U.S. PATENT DOCUMENTS

| | | | | |
|---|---|---|---|---|
| 4,112,354 A * | 9/1978 | Bahder | .............. | G01R 31/1272 324/544 |
| 8,269,482 B2 * | 9/2012 | Banhegyesi | ......... | G01R 15/183 324/117 R |
| 8,320,555 B2 * | 11/2012 | Ray | .......................... | H04M 3/34 379/417 |
| 2010/0067665 A1 * | 3/2010 | Ray | .......................... | H04M 3/34 379/3 |
| 2013/0151186 A1 * | 6/2013 | Feldkamp | .............. | A61B 5/053 702/65 |
| 2014/0111186 A1 * | 4/2014 | Niemann | ........... | G01R 31/2839 324/98 |
| 2015/0002169 A1 * | 1/2015 | Lu | ......................... | G01R 35/005 324/609 |

FOREIGN PATENT DOCUMENTS

| | | |
|---|---|---|
| CN | 104251982 A | 12/2014 |
| TW | 201423119 A | 6/2014 |

* cited by examiner

*Primary Examiner* — Tung X Nguyen
*Assistant Examiner* — Robert P Alejnikov, Jr.
(74) *Attorney, Agent, or Firm* — McClure, Qualey & Rodack, LLP

(57) ABSTRACT

A current sensing circuit includes a sensing resistor, a current monitor, a variable resistor, and a processor. The sensing resistor is disposed on a to-be-sensed circuit and coupled between first and second first voltage terminals of the to-be-sensed circuit. The current monitor includes first and second terminals. A first winding is coupled between the first terminal and the first voltage terminal, and a second winding is coupled between the second terminal and the second voltage terminal. The variable resistor is connected in series with the first winding between the first voltage terminal and the first terminal. The current monitor obtains a sensed current according to a first voltage on the first terminal, a second voltage on the second terminal, and an impedance of the sensing resistor and generates a sensing signal. The processor determines whether to adjust an impedance of the variable resistor according to the sensing signal.

10 Claims, 4 Drawing Sheets

CURRENT SENSING CIRCUIT

CROSS REFERENCE TO RELATED APPLICATIONS

This application claims priority of Taiwan Patent Application No. 110108049, filed on Mar. 8, 2021, the entirety of which is incorporated by reference herein.

BACKGROUND OF THE INVENTION

Field of the Invention

The present invention relates to a current sensing circuit, and more particularly to a current sensing circuit which can adjust impedance of a sensing path according to a sensed current.

Description of the Related Art

Generally, in order to protect components in an electronic device from being affected by excessive currents, a current monitor is configured to monitor a current between two nodes/terminals in a specific circuit or device, and the electronic device further performs a protection operation based on the sensed current. For example, for a notebook computer, the case where a large current flowing through a specific circuit or device is sensed indicates that the temperature of the specific circuit or device is increased due to the large current. At this time, the notebook computer can activate the fan or reduce the operation performance to reduce the temperature of the specific circuit or device. However, equivalent impedances of at least two windings used in a current sensing path on a circuit board of an electronic device may not match each other, which results in an error in the sensed current. Thus, the electronic device may be unable to perform an operation corresponding to the actual current, which is disadvantageous to vehicle electronic device. In a vehicle electronic equipment, since every data of the vehicle electronic equipment is related to the safety of human life, it is important that the vehicle electronic equipment can accurately sense a current in a specific circuit or device.

BRIEF SUMMARY OF THE INVENTION

The present invention provides a current sensing circuit for an electronic system. The electronic system comprises a to-be-sensed circuit. A first voltage terminal of the to-be-sensed circuit is coupled to a first winding, and a second voltage terminal of the to-be-sensed circuit is coupled to a second winding. The current sensing circuit comprises a sensing resistor, a current monitor, a first variable resistor, and a processor. The sensing resistor is disposed in the to-be-sensed circuit and coupled between the first voltage terminal and the second voltage terminal. The current monitor comprises a first terminal and a second terminal. The first winding is coupled between the first terminal and the first voltage terminal, and the second winding is coupled between the second terminal and the second voltage terminal. The first variable resistor is connected in series with the first winding between the first terminal and the first voltage terminal. The processor is coupled to the current monitor. The current monitor obtains a sensed current according to a first voltage on the first terminal, a second voltage on the second terminal, and an impedance of the sensing resistor and further generates a sensing signal according to the sensed current. The processor receives the sensing signal and determines whether to adjust an impedance of the first variable resistor according to the sensing signal.

According to the above embodiment of the current sensing circuit, through the adjustment of the first variable resistor, the total equivalent impedance of the first winding and the first variable resistor can match the equivalent impedance of the second winding. In response to the impedance matching, the sensed current obtained by the current monitor can accurately represent the actual current flowing through the sensing resistor, that is, the current difference between the sensed current and the actual current flowing through the sensing resistor is linear or close to linear with time. Even if the equivalent impedance of the first or second winding changes due to the variations of the operation environment of the electronic system, the sensed current obtained by the current monitor can still accurately represent the actual current flowing through the sensing resistor, such that the electronic system can accurately and instantly perform a specific operation.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated model of carrying out the invention. This description is made for the purpose of illustrating the general principles of the invention and should not be taken in a limiting sense. The scope of the invention is best determined by reference to the appended claims.

Figure 1:
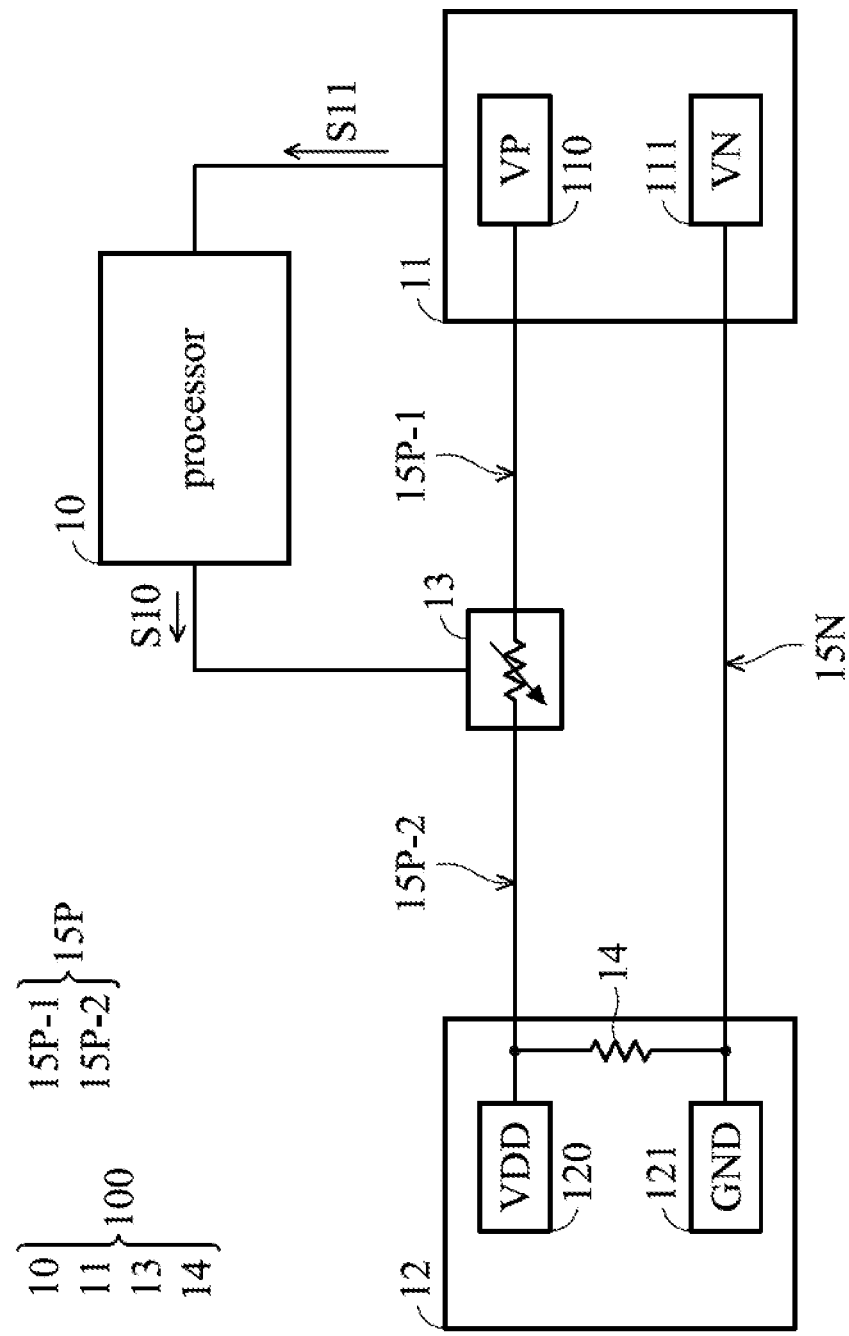
FIG. 1 is a schematic diagram of an electronic system with a current sensing circuit according to an embodiment of the present invention.

FIG. 1 is a schematic diagram of an electronic system with a current sensing circuit according to an embodiment of the present invention. Referring to FIG. 1, the electronic system 1 comprises a processor 10, a current monitor 11, at least one operation circuit, a digital variable resistor 13, and a sensing resistor 14. In the embodiment of FIG. 1, the processor 10, the current monitor 11, at least one operation circuit, the digital variable resistor 13, and the sensing resistor 14 are disposed on the same circuit board. In other embodiments, the current monitor 11, the at least one operation circuit, the digital variable resistor 13, and the sensing resistor 14 are disposed on one circuit board, and the processor 10 is disposed on another circuit board.

The electronic system 1 may comprise a plurality of operation circuits to perform a plurality of specific operations or functions. In the embodiment of FIG. 1, one operation circuit is taken as an example for description.

When the current monitor 11 performs a current sensing operation, the operation circuit serves as a circuit to be sensed (hereinafter, the circuit to be sensed is referred to as "to-be-sensed circuit") 12. The current monitor 11 comprises a first terminal 110 and a second terminal 111. The to-be-sensed circuit 12 comprises a first voltage terminal 120 and a second voltage terminal 121. The sensing resistor 14 has a constant impedance. The sensing resistor 14 is disposed in the to-be-sensed circuit 12 and coupled between the first voltage terminal 120 and the second voltage terminal 121 of the to-be-sensed circuit 12. In the embodiment of FIG. 1, when the electronic system 1 is powered on, the first voltage terminal 120 receives an operation voltage VDD of the to-be-sensed circuit 12, and the second voltage terminal 121 receives a ground voltage GND. The first terminal 110 of the current monitor 11 is connected to the first voltage terminal 120 of the to-be-sensed circuit 12 through a first winding 15P on the circuit board, and the second terminal 111 of the current monitor 11 is connected to the second voltage terminal 121 of the to-be-sensed circuit 12 through a second winding 15N on the circuit board.

Figure 2:
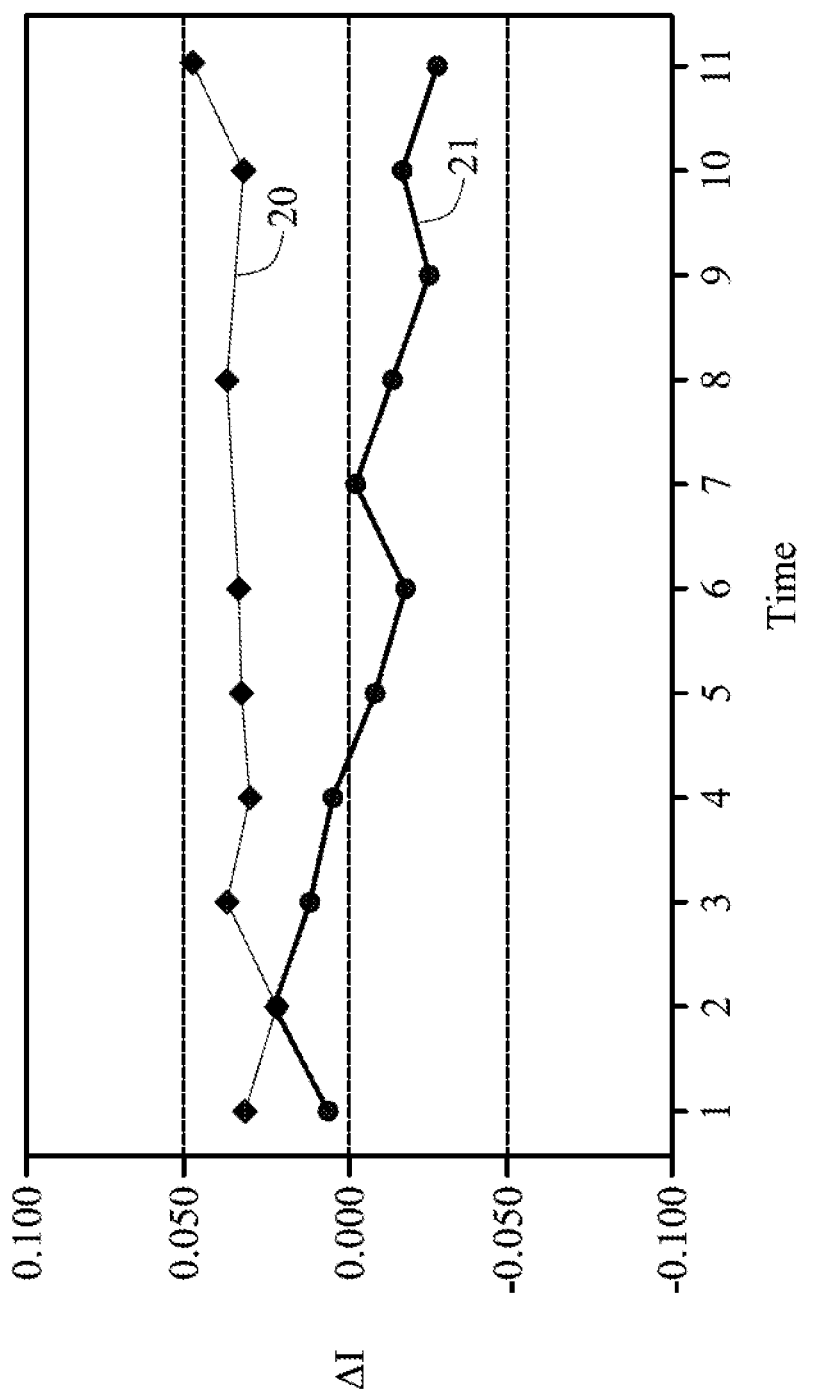
FIG. 2 shows a change with time in current difference between a sensed current and an actual current under an ideal condition and an actual operation.

It is assumed that the digital variable resistor 13 is not connected in series with the first winding 15P. After the layout of the circuit board of the electronic system 1 is completed, ideally, the equivalent impedance of the first winding 15P matches the equivalent impedance of the second winding 15N (for example, the length and width of the first winding 15P are equal to the length and width of the second winding 15, respectively). Therefore, the sensed current I can accurately represent the actual current flowing through the resistor 14, that is, the current difference ΔI between the sensed current I and the actual current flowing through the sensing resistor 14 is linear (or close to linear) with time, as shown by the curve 20 in FIG. 2. However, in an actual operation, due to variations in the layout of the circuit board, the manufacturing process of the circuit board, or environment, the equivalent impedance of the first winding 15P and the equivalent impedance of the second winding 15N may become mismatched (for example, the length of the first winding 15P is not equal to the length of the second winding 15N, or the width of the first winding 15P is not equal to the width of the second winding 15N), the sensed current I cannot accurately represent the accrual current flowing through the sensing resistor 14, that is, an error occurs in the sensing operation of the current monitor 11, which results in that the current difference ΔI between the sensed current I and the actual current flowing through the sensing resistor 14 is not linear with time, as shown by the curve 21 in FIG. 2.

In order to eliminate the above-mentioned error, according to the embodiments of the present invention, a digital variable resistor 13 is connected in series with the first winding 15P or the second winding 15N. The variable resistor 13 has an initial impedance.

In the embodiment of FIG. 1, it is assumed that, after the circuit board layout of the electronic system 1 is completed, the length of the first winding 15P is shorter than the length of the second winding 15N, and the digital variable resistor 13 is connected in series with the first winding 15P. The first winding 15P and the second winding 15N shown in FIG. 1 are only used to illustrate the connection between the to-be-sensed circuit 12 and the current monitor 11. The length of the first winding 15P and the second winding 15N shown in FIG. 1 is not the actual length thereof on the circuit board. Referring to FIG. 1, in detail, the first winding 15P is divided into a first winding section 15P-1 and a second winding section 15P-2, and the digital variable resistor 13 is coupled between the first winding section 15P-1 and the second winding section 15P-2.

The impedance of the digital variable resistor 13 can be adjusted by a control signal S10 generated by the processor 10. The voltage level of the control signal S10 can determine the adjustment direction of the impedance of the digital variable resistor 13. For example, when the control signal S10 has a high voltage level, the impedance of the digital variable resistor 13 increases (the adjustment direction is from a low impedance to a high impedance). Conversely, when the control signal S10 has a low voltage level, the impedance of the digital variable resistor 13 decreases (the adjustment direction is changed from a high impedance to a low impedance).

In the embodiment of FIG. 1, the processor 10, the current monitor 11, the variable resistor 13, and the sensing resistor 14 constitute a current sensing circuit 100. The operation of the current sensing circuit 100 will be described in detail below. The current sensing circuit 100 can operate in different modes, such as a test mode and an operation mode.

In one embodiment, the test mode occurs when the circuit board layout of the electronic system 1 is completed but before the electronic system 1 has not left the factory. The operation mode occurs during a period when the electronic equipment using the electronic system 1 is enabled after the electronic system 1 leaves the factory. In an embodiment, the electronic equipment may be, for example, a transportation equipment, such as an aircraft, a car, a motorcycle, and so on.

In the test mode, the digital variable resistor 13 initially has a reference impedance. When the electronic system 1 is powered on, the current monitor 11 detects the first voltage VP on the first terminal 110 and the second voltage VN on the second terminal 111. According to the above description, the sensing resistor 14 has a constant impedance (R14). The current monitor 11 stores the impedance R14 into a storage device which is disposed in the current monitor 11. Referring to FIG. 1, the current sensing path passes through the first terminal 110, the first winding 15P (15P-1 and 15P-2), the digital variable resistor 13, the sensing resistor 14, the second winding 15N, and the second terminal 111. The voltage difference (VP−VN) between the first voltage VP and the second voltage VN can represent the total equivalent impedance of the first winding 15P and the digital variable resistor 13 (that is, the sum of the equivalent impedance of the first winding 15P and the reference impedance of the digital variable resistor 13) matches the equivalent impedance of the second winding 15N. Based on Ohm's law, the current monitor 11 performs an operation on the impedance R14 and the detected voltages VP and VN to obtain a sensed current $$\left(I = \frac{VP - VN}{R14}\right).$$

The current monitor 11 generates a sensing signal S11 according to the obtained sensed current I, wherein the sensing signal S11 represents the value of the sensed current I.

When the current monitor 11 generates the sensing signal S11, the processor 10 receives the sensing signal Si 1 and determines whether the value of the sensed current I is within a predetermined current range (IR) according to the sensing signal S11. In the embodiment of the present invention, the processor 10 pre-defines a predetermined current value IPRE, and further defines the predetermined current range according to the tolerance of the electronic system 1 for current detection. There are an upper limit value THH and a lower limit value THL for the predetermined current range IR, and the predetermined current value IPRE is within the predetermined current range IR, that is, THL<IPRE<THH.

The case where the processor 10 determines that the value of the sensed current I is within the predetermined current range IR (that is, THL<I<THH) indicates that the total equivalent impedance of the first winding 15P and the digital variable resistor 13 matches the equivalent impedance of the second winding 15N, or that the difference between the total equivalent impedance of the first winding 15P and the digital variable resistor 13 and the equivalent impedance of the second winding 15N is within an allowable range, that is, the obtained sensed current I can accurately represent the actual current flowing through the sensing resistor 14. At this time, the processor 10 does not adjust the impedance of the digital variable resistor 13 according to the determination result. In other words, the impedance of the digital variable resistor 13 is maintained at the reference impedance. Then, the test mode ends.

The case where the processor 10 determines that the value of the sensed current I is not within the predetermined current range IR (that is, I<THL or I>THH) indicates that the total equivalent impedance of the first winding 15P and the digital variable resistor 13 does not match the equivalent impedance of the second winding 15N, or that the difference between the total equivalent impedance of the first winding 15P and the digital variable resistor 13 and the equivalent impedance of the second winding 15N is not within an allowable range, that is, the obtained sensed current I does not accurately represent the actual current flowing through the sensing resistor 14. At this time, the processor 10 obtains the information about that the impedance of the digital variable resistor 13 needs to be adjusted according to the above determination result. Therefore, the processor 10 generates the control signal S10 to adjust the impedance of the digital variable resistor 13. Based on the above operation, after the adjustment of the impedance of the digital variable resistor 13, the total equivalent impedance of the first winding 15P and the digital variable resistor 13 becomes to match the equivalent impedance of the second winding 15N, or that the difference between the total equivalent impedance of the first winding 15P and the digital variable resistor 13 and the equivalent impedance of the second winding 15N becomes within the allowable range. The sensed current I obtained at this time gradually changes toward the predetermined current value IPRE and finally remains equal to or close to the predetermined current value IPRE. Then, the test mode ends.

Through the operation of the current detection circuit 100 in the test mode, it can be ensured that, before the electronic system 1 leaves the factory, the total equivalent impedance of the first winding 15P and the digital variable resistor 13 matches the equivalent impedance of the second winding 15N, or that the difference between the total equivalent impedance of the first winding 15P and the digital variable resistor 13 and the equivalent impedance of the second winding 15N is within an allowable range, so that the sensed current I can accurately represent the actual current flowing through the sensing resistor 14. In other words, current difference ΔI between the sensed current I and the actual current flowing through the sensing resistor 14 is linear or close to linear with time.

The reference impedance of the digital variable resistor 13 or the last adjusted impedance of the digital variable resistor 13 before the end of the test mode is used as an initial impedance for use in the operation mode.

During the period when the electronic equipment using the electronic system 1 is enabled after the electronic system 1 leaves the factory, the equivalent impedance of each of the first winding 15P and the second winding 15N may change due to variations in the operation environment of the electronic equipment (for example, the variation in the temperature), resulting in a mismatch between the total equivalent impedance of the first winding 15P and the digital variable resistor 13 and the equivalent impedance of the second winding 15N.

Therefore, when the electronic equipment is enabled, the current sensing circuit 100 is switched to the operation mode. In the operation mode, the digital variable resistor 13 has the aforementioned initial impedance. At this time, the electronic system 1 is powered on. The current monitor 11 detects the first voltage VP on the first terminal 110 and the second voltage VN on the second terminal 111. Based on Ohm's law, the current monitor 11 performs an operation on the impedance R14 and the detected voltages VP and VN to obtain a sensed current $$\left(I = \frac{VP - VN}{R14}\right).$$

The current monitor 11 generates the sensed signal S11 according to the obtained sensed current I, wherein the sensing signal S11 represents the value of the sensed current I.

When the current monitor 11 generates the sensing signal S11, the processor 10 receives the sensing signal S11 and determines whether the amount of the change in the value of the sensed current I in a predetermined period of time is greater than a threshold value.

In an embodiment, the case where the processor 10 determines that the amount of the change in the value of the sensed current I in the predetermined period of time is not greater than the threshold value indicates that the total equivalent impedance of the first winding 15P and the digital variable resistor 13 matches the equivalent impedance of the second winding 15N, or that the difference between the total equivalent impedance of the first winding 15P and the digital variable resistor 13 and the equivalent impedance of the second winding 15N is within an allowable range, that is, the obtained sensed current I can accurately represent the actual current flowing through the sensing resistor 14. At this time, the processor 10 does not adjust the impedance of the digital variable resistor 13. In other words, the impedance of the digital variable resistor 13 is maintained at the initial impedance.

In an embodiment, the case where the processor 10 determines that the amount of the change in the value of the sensed current I in the predetermined period of time is greater than the threshold value indicates that the total equivalent impedance of the first winding 15P and the digital variable resistor 13 does no match the equivalent impedance of the second winding 15N, or that the difference between the total equivalent impedance of the first winding 15P and the digital variable resistor 13 and the equivalent impedance of the second winding 15N is not within the allowable range, due to the variations in the operation environment. In this case, the obtained sensed current I cannot accurately represent the actual current flowing through the sensing resistor 14. At this time, the processor 10 obtains the information about that the impedance of the digital variable resistor 13 needs to be adjusted according to the above determination result. Therefore, the processor 10 generates the control signal S10 to adjust the impedance of the digital variable resistor 13. Based on the above operation, after the adjustment of the impedance of the digital variable resistor 13, the total equivalent impedance of the first winding 15P and the digital variable resistor 13 becomes to match the equivalent impedance of the second winding 15N, or that the difference between the total equivalent impedance of the first winding 15P and the digital variable resistor 13 and the equivalent impedance of the second winding 15N becomes within the allowable range.

According to the above embodiment, in the operation mode, even if the equivalent impedance of each winding on the circuit board changes due to the variations of the operation environment of the electronic equipment, the current detection circuit 100 can adjust the impedance of the digital variable resistor 13, such that the total equivalent impedance of the first winding 15P and the digital variable resistor 13 matches the equivalent impedance of the second winding 15N, or the difference between the total equivalent impedance of the first winding 15P and the digital variable resistor 13 and the equivalent impedance of the second winding 15N is within the allowable range. Therefore, the sensed current I obtained by the current monitor 11 can accurately represent the actual current flowing through the sensing resistor 14, that is, the current difference ΔI between the sensed current I and the actual current flowing through the sensing resistor 14 is linear (or close to linear) with time. The electronic equipment can accurately and instantly perform a specific operation according to the obtained sensed current I.

In the embodiment of FIG. 1, the digital variable resistor 13 is connected in series with the first winding 15P. In other embodiments where the length of the second winding 15N is shorter than the length of the first winding 15P after the layout of the circuit board of the electronic system 1 is completed, a digital variable resistor is connected in series with the second winding 15N, but the digital variable resistor 13 is not connected in series with the first winding 15P.

Figure 3:
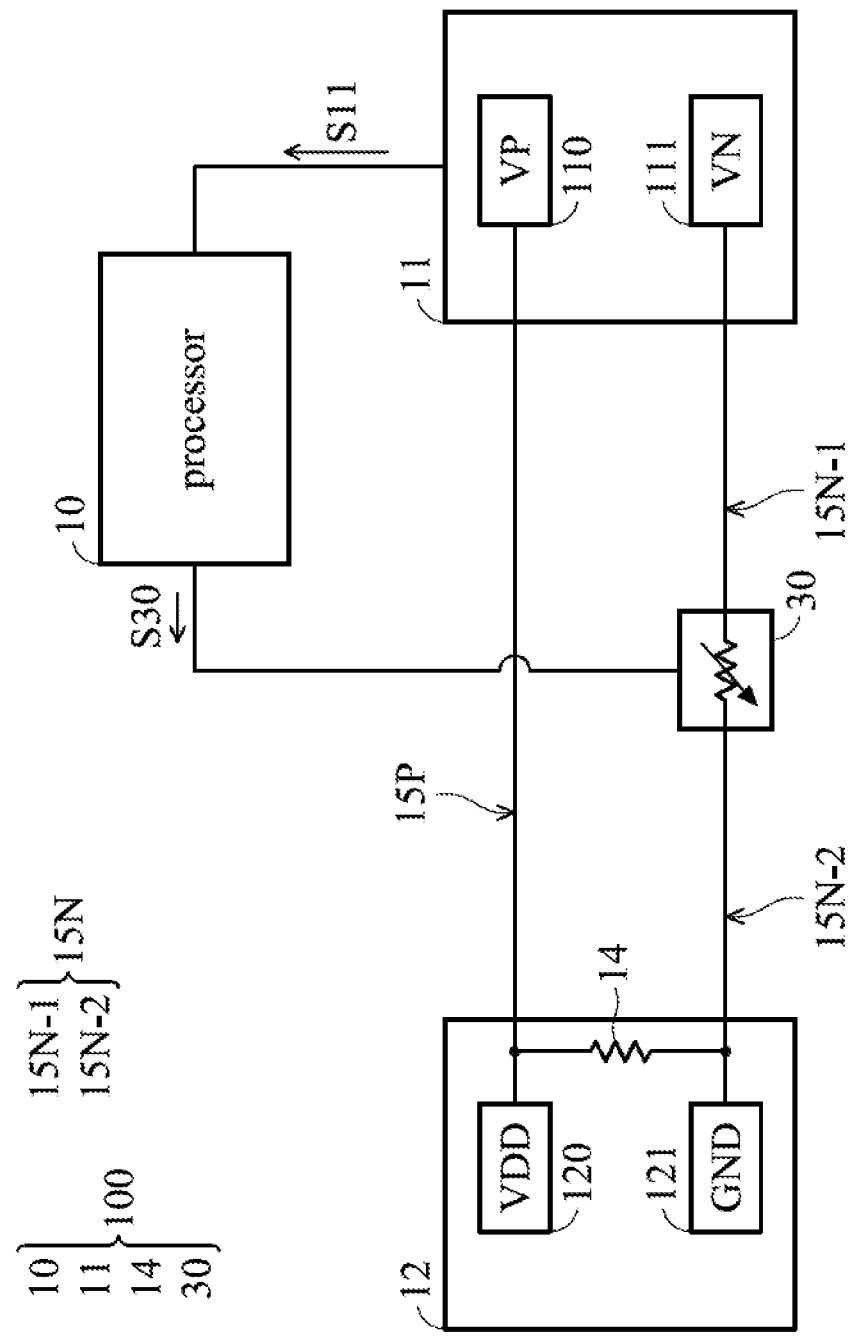
FIG. 3 is a schematic diagram of an electronic system with a current sensing circuit according to another embodiment of the present invention.

Referring to FIG. 3, an electronic system 3 is substantially the same as the electronic system 1 of FIG. 1. The difference between the electronic systems 1 and 3 is that there is a digital variable resistor 30 connected in series with the second winding 15N, while no digital variable resistor is connected in series with the first winding 15P. In the embodiment, the processor 10, the current monitor 11, the variable resistor 30, and the sensing resistor 14 constitute the current sensing circuit 100.

As shown in FIG. 3, in detail, the second winding 15N is divided into a third winding section 15N-1 and a fourth winding section 15N-2, and the digital variable resistor 30 is coupled between the third winding section 15N-1 and the fourth winding section 15N-2. The impedance of the digital variable resistor 30 can be adjusted by a control signal S30 which is generated by the processor 10.

In the embodiment in FIG. 3, the operations of the current monitor 11 and the processor 10 are the same as those in the embodiment in FIG. 1, and the related description is omitted here. It should be noted that, in the embodiment of FIG. 3, the processor 10 generates the control signal S30. The mechanism for generating the control signal S30 by the processor 10 is the same as that for generating the control signal S10 in the embodiment of FIG. 1, and the related description is omitted here.

Figure 4:
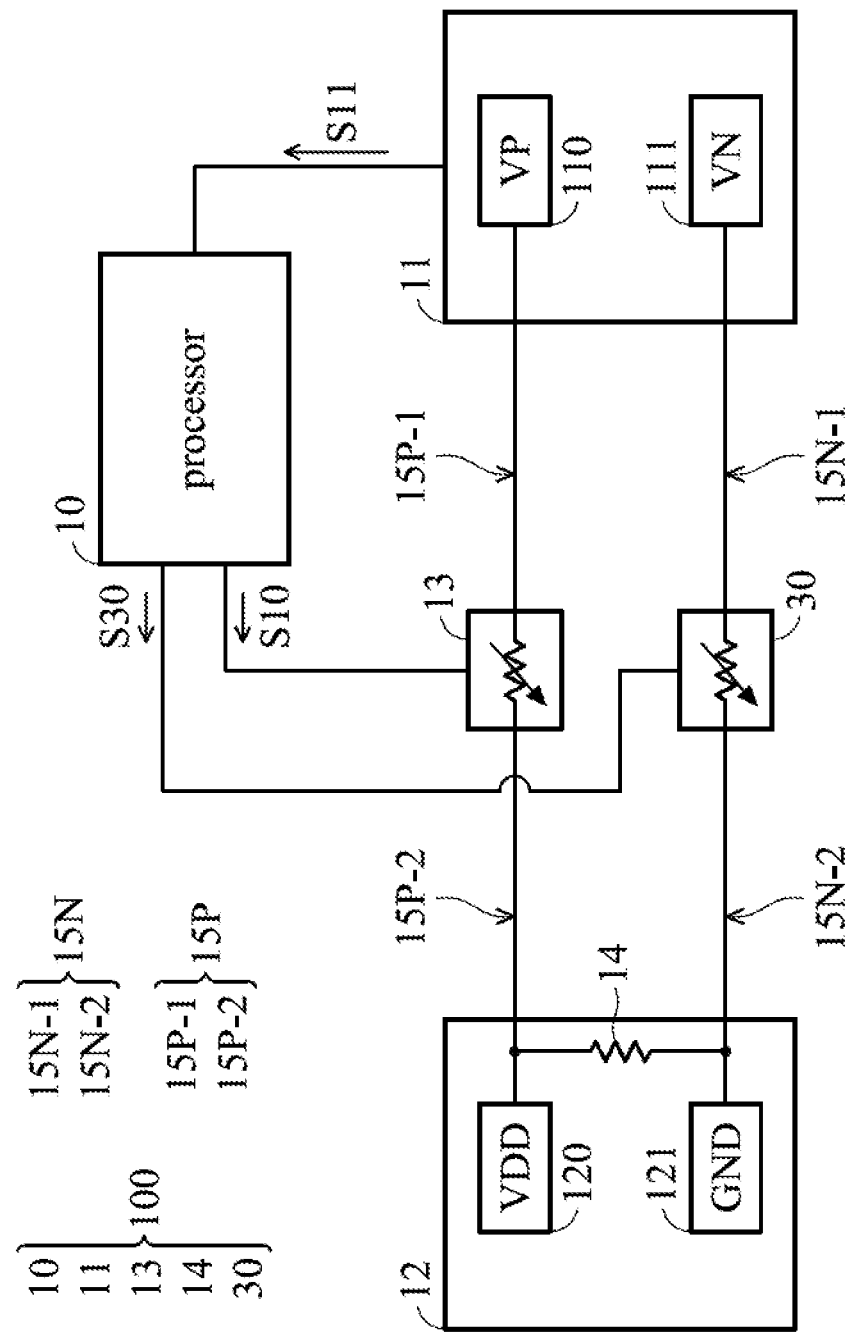
FIG. 4 is a schematic diagram of an electronic system with a current sensing circuit according to another embodiment of the present invention.

In other embodiments, each of the first winding 15P and the second winding 15N is connected in series with a digital variable resistor. Referring to FIG. 4, an electronic system 4 is substantially the same as the electronic system 1 and the electronic system 3. The difference between the electronic system 4 and the electronic systems 1 and 3 is that a digital variable resistor 13 is connected in series with the first winding 15P and a digital variable resistor 30 is connected in series with the second winding 15N. In other words, the electronic system 4 is a combination of the electronic systems 1 and 3. In the embodiment, the processor 10, the current monitor 11, the digital variable resistors 13 and 30, and the sensing resistor 14 constitute the current sensing circuit 100. For the serial connection of the digital variable resistors 13 and 30 with the windings 15P and 15N, please refer to the related descriptions of the embodiments shown in FIGS. 1 and 3, and the description is omitted here.

In the electronic system 4, the sensing operation of the current monitor 11 and the determination operation of the processor 10 are the same as those in the embodiment in FIG. 1, and the related description is omitted here. According to an embodiment, in the test mode, when the processor 10 determines that the value of the sensed current I is not within the predetermined current range IR, the processor 10 can generate one of the control signals S10 and S30 to adjust the impedance of the corresponding digital variable resistor among the variable resistors 13 and 30; in the operation mode, when the processor 10 determines that the amount of the change in the value of the sensed current I in the predetermined period of time is greater than the threshold value, the processor 10 can generate one of the control signals S10 and S30 to adjust the impedance of the corresponding digital variable resistor among the variable resistors 13 and 30. In other words, the processor 10 does not adjust the impedances of the digital variable resistors 13 and 30 at the same time according to the determination result.

In other embodiments, the processor 10 can simultaneously adjust the impedances of the digital variable resistors 13 and 30 according to the determination result. In detail, in the test mode, when the processor 10 determines that the value of the sensed current I is not within the predetermined current range IR, the processor 10 can generate the control signals S10 and S30 to respectively adjust the impedances of the variable resistors 13 and 30 at the same time; in the operation mode, when the processor 10 determines that the amount of the change in the value of the sensed current I in the predetermined period of time is greater than the threshold value, the processor 10 can generate the control signals S10 and S30 to respectively adjust the impedances of the variable resistors 13 and 30 at the same time.

In the case where the impedances of the digital variable resistors 13 and 30 are adjusted at the same time, the adjustment direction of the digital variable resistor 13 is opposite to the adjustment direction of the digital variable resistor 30. In detail, one of the control signals S13 and S30 generated by the processor 10 has a high voltage level for increasing the impedance of the corresponding digital variable resistor, while the other of the control signals S13 and S30 has a low voltage level for decreasing the impedance of the corresponding digital variable resistor. By adjusting the impedances of the digital variable resistors 13 and 30 at the same time, the total equivalent impedance of the first winding 15P and the digital variable resistor 13 can change to match the total equivalent impedance of the second winding 15N and the digital variable resistor 30 in a short time While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A current sensing circuit for an electronic system, wherein the electronic system comprises a to-be-sensed circuit, a first voltage terminal of the to-be-sensed circuit is coupled to a first winding, a second voltage terminal of the to-be-sensed circuit is coupled to a second winding, and the current sensing circuit comprises:
    a sensing resistor disposed in the to-be-sensed circuit and coupled between the first voltage terminal and the second voltage terminal;
    a current monitor comprising a first terminal and a second terminal, wherein the first winding is coupled between the first terminal and the first voltage terminal, and the second winding is coupled between the second terminal and the second voltage terminal;
    a first variable resistor connected in series with the first winding between the first terminal and the first voltage terminal; and
    a processor coupled to the current monitor;
    wherein the current monitor obtains a sensed current according to a first voltage on the first terminal, a second voltage on the second terminal, and an impedance of the sensing resistor and generates a sensing signal according to the sensed current, and
    wherein the processor receives the sensing signal and determines whether to adjust an impedance of the first variable resistor according to the sensing signal.

2. The current sensing circuit as claimed in claim 1, wherein:
    the processor determines whether a value of the sensed current is within a predetermined current range according to the sensing signal, and
    in response to the processor determining that the value of the sensed current is not within the predetermined current range, the processor adjusts the impedance of the first variable resistor, so that the value of the sensed current is close to a predetermined current value within the predetermined current range.

3. The current sensing circuit as claimed in claim 1, wherein:
    the processor determines whether an amount of change in a value of the sensed current in a predetermined period of time is greater than a predetermined value according to the sensing signal, and
    in response to the processor determining that the amount of change in the value of the sensed current in the predetermined period of time is greater than the predetermined value, the processor adjusts the impedance of the first variable resistor.

4. The current sensing circuit as claimed in claim 1, wherein one of the first voltage terminal and the second voltage terminal receives an operation voltage of the to-be-sensed circuit, and the other of the first voltage terminal and the second voltage terminal receives a ground voltage of the to-be-sensed circuit.

5. The current sensing circuit as claimed in claim 1, further comprising:
    a second variable resistor connected in series with the second winding between the second terminal and the second voltage terminal,
    wherein the processor further determines whether to adjust an impedance of the second variable resistor according to the sensing signal.

6. The current sensing circuit as claimed in claim 5, wherein:
    the processor determines whether a value of the sensed current is within a predetermined current range according to the sensing signal, and
    in response to the processor determining that the value of the sensed current is not within the predetermined current range, the processor adjusts at least one of the impedance of the first variable resistor and the impedance of the second variable resistor, so that the value of the sensed current is close to a predetermined current value within the predetermined current range.

7. The current sensing circuit as claimed in claim 6, wherein when the processor adjusts the impedance of the first variable resistor and the impedance of the second variable resistor at the same time, the processor increases the impedance of one of the first variable resistor and the second variable resistor and decreases the impedance of the other of the first variable resistor and the second variable resistor.

8. The current sensing circuit as claimed in claim 5, wherein:
    the processor determines whether an amount of change in a value of the sensed current in a predetermined period of time is greater than a predetermined value according to the sensing signal, and
    in response to the processor determining that the amount of change in the value of the sensed current in the predetermined period of time is greater than the predetermined value, the processor adjusts at least one of the impedance of the first variable resistor and the impedance of the second variable resistor.

9. The current sensing circuit as claimed in claim 8, wherein when the processor adjusts the impedance of the first variable resistor and the impedance of the second variable resistor at the same time, the processor increases the impedance of one of the first variable resistor and the second variable resistor and decreases the impedance of the other of the first variable resistor and the second variable resistor.

10. The current sensing circuit as claimed in claim 1, wherein the electronic system is implemented in a transportation equipment.

* * * * *